(12) United States Patent
Yasuda et al.

(10) Patent No.: US 10,553,552 B2
(45) Date of Patent: Feb. 4, 2020

(54) WAFER LAMINATE AND METHOD OF PRODUCING THE SAME

(71) Applicant: SHIN-ETSU CHEMICAL CO., LTD., Tokyo (JP)

(72) Inventors: Hiroyuki Yasuda, Annaka (JP); Michihiro Sugo, Annaka (JP); Hideto Kato, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 91 days.

(21) Appl. No.: 15/728,958

(22) Filed: Oct. 10, 2017

(65) Prior Publication Data

US 2018/0102334 A1    Apr. 12, 2018

(30) Foreign Application Priority Data

Oct. 11, 2016  (JP) .................................. 2016-199819

(51) Int. Cl.
*H01L 23/00* (2006.01)
(52) U.S. Cl.
CPC .............. *H01L 24/04* (2013.01); *H01L 24/03* (2013.01)
(58) Field of Classification Search
None
See application file for complete search history.

(56) References Cited

U.S. PATENT DOCUMENTS

| 8,965,295 B2 | 2/2015 | Cendrillon et al. |
| 9,054,765 B2 | 6/2015 | Cendrillon et al. |
| 2003/0064305 A1 | 4/2003 | Ono et al. |
| 2014/0151328 A1* | 6/2014 | Miyanari ............ H01L 21/6836 216/33 |

FOREIGN PATENT DOCUMENTS

| JP | 2003-177528 A | 6/2003 |
| JP | 2014-129431 A | 7/2014 |
| JP | 2014-534721 A | 12/2014 |

(Continued)

OTHER PUBLICATIONS

A machine-generated English translation of JP 2015191940 (Year: 2016).*

(Continued)

*Primary Examiner* — Bo B Jang
(74) *Attorney, Agent, or Firm* — Westerman, Hattori, Daniels & Adrian, LLP

(57) ABSTRACT

To provide a wafer laminate which permits easy bonding between a support and a wafer, permits easy delamination of a wafer from a support, enables enhanced productivity of a thin wafer, and is suited to production of a thin wafer, and for a method of producing the wafer laminate.
The wafer laminate includes a support, an adhesive layer formed on the support, and a wafer laminated in such a manner that its front surface having a circuit surface faces the adhesive layer. The adhesive layer includes a light-shielding resin layer A and a non-silicone thermoplastic resin-coating resin layer B in this order from the support side. The resin layer A is composed of a resin that contains a repeating unit having a condensed ring, and the resin layer B has a storage elastic modulus E' at 25° C. of 1 to 500 MPa and a tensile break strength of 5 to 50 MPa.

6 Claims, 1 Drawing Sheet

(56) References Cited

FOREIGN PATENT DOCUMENTS

| JP | 2015-191940 A | | 11/2015 |
|---|---|---|---|
| JP | 2015191940 | * | 11/2015 |
| WO | 2015/072418 A1 | | 5/2015 |

OTHER PUBLICATIONS

Extended European Search Report dated Mar. 15, 2018, issued in counterpart application No. 17195677.4. (10 pages).
Office Action dated Jun. 25, 2019, issued in counterpart JP Application No. 2016-199819, with English translation (8 pages).

* cited by examiner

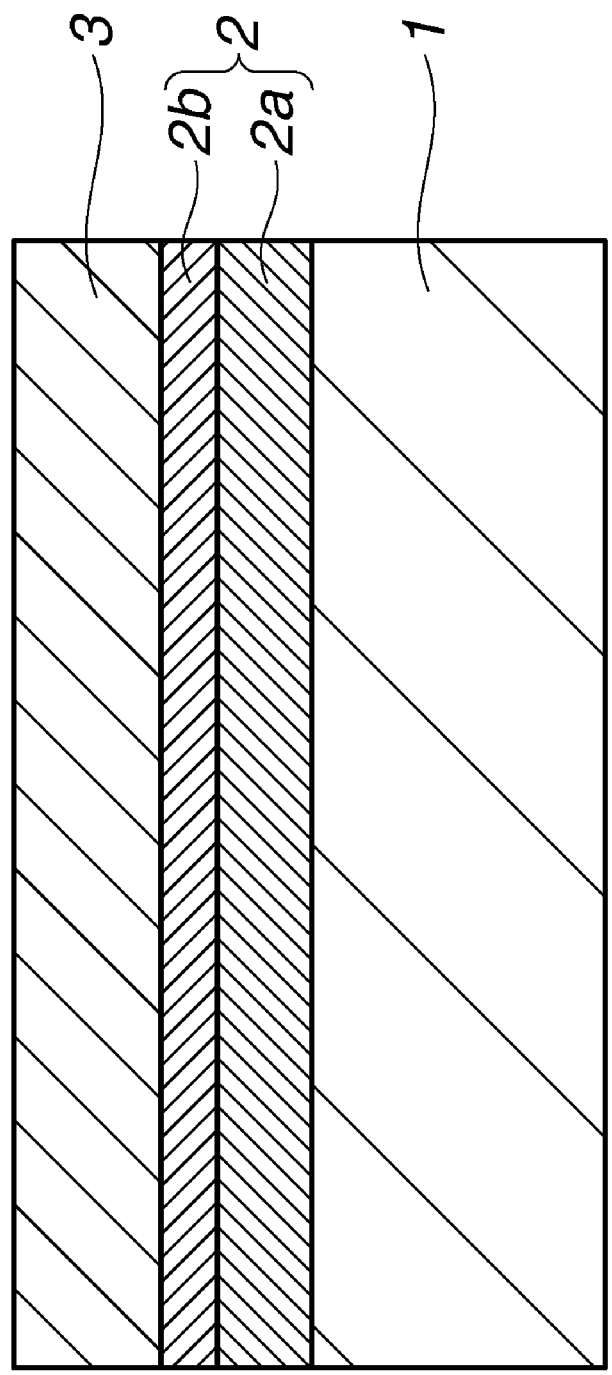

WAFER LAMINATE AND METHOD OF PRODUCING THE SAME

CROSS-REFERENCE TO RELATED APPLICATION

This non-provisional application claims priority under 35 U.S.C. § 119(a) on Patent Application No. 2016-199819 filed in Japan on Oct. 11, 2016, the entire contents of which are hereby incorporated by reference.

TECHNICAL FIELD

The present invention relates to a wafer laminate in the semiconductor field, and a method of producing the same.

BACKGROUND ART

Three-dimensional semiconductor mounting has come to be indispensable to realization of further enhance density and capacity. The three-dimensional mounting technology is a semiconductor production technology in which semiconductor chips are each thinned and they are stacked to form a multilayer structure while interconnecting them by silicon through electrodes (through silicon via (TSV)). To realize this, it is necessary to thin the substrate formed with a semiconductor circuit by grinding the non-circuit-formation surface (also called the "back side") thereof, and to form electrodes inclusive of the TSV on the back side. Conventionally, in performing the back side grinding of a silicon substrate, a protective tape is adhered to the surface opposite to the surface to be ground, thereby to prevent the wafer from breaking during grinding. However, the protective tape uses an organic resin film as a support base material, and is insufficient in strength and heat resistance though flexible, so that the tape is unsuited to formation of the TSV or formation of a wiring layer on the back side.

In view of this, there has been proposed a system in which a semiconductor substrate is bonded to a support such as silicon and glass through an adhesive layer and which sufficiently withstand the steps of back side grinding, formation of TSV, and formation of electrodes on the back side. In this case, important is the adhesion layer in bonding the substrate to the support. The adhesion layer is required to be able to bond the substrate to the support without leaving any gap therebetween, to have durability enough to withstand the later steps, and to enable the thin wafer to finally be released from the support easily. The adhesion layer will be referred to herein as a temporary adhesion layer (or temporary adhesive layer) since the wafer is finally released (delaminated) from the support.

Hitherto, as a known temporary adhesion layer and releasing method therefor, a technology has been proposed in which a heat-fusible hydrocarbon compound is used as an adhesive, and bonding and releasing are conducted in a heat-molten state (JP-A 2003-177528). Although the technology is simple because of controlling by only heating, however, the technology is applicable to a limited range, due to insufficient thermal stability at high temperatures above 200° C.

In addition, a technology in which a silicone pressure-sensitive adhesive is used for the temporary adhesive layer has been proposed (WO 2015/072418). In this technology, a substrate is bonded to a support by use of an addition-curable type silicone pressure-sensitive adhesive, and, at the time of delamination, the laminate is immersed in a chemical capable of dissolving or decomposing the silicone resin, to thereby separate the substrate from the support. Therefore, it takes a very long time to achieve delamination, and it is difficult to apply this technology to an actual production process.

On the other hand, there has also been proposed a technology in which an adhesive containing a light-absorbing substance is irradiated with high-intensity light to decompose an adhesive layer, thereby releasing the adhesive layer from the support (JP-A 2013-534721). In this method, there is a merit that the process time per substrate in separating the substrate from the support is shortened, but a metallic compound must be used for converting the irradiation light into heat, so that there is a risk of contamination of the substrate with metal.

CITATION LIST

Patent Document 1: JP-A 2003-177528
Patent Document 2: WO 2015/072418
Patent Document 3: JP-A 2013-534721

DISCLOSURE OF INVENTION

An object of the present invention is to provide a wafer laminate which permits easy bonding between a support and a wafer, enables formation of a heavily stepped substrate in a uniform thickness, is high in compatibility to steps of TSV formation and wiring on back side of a wafer, is excellent in resistance to wafer thermal processes such as chemical vapor deposition (CVD), permits easy delamination of a wafer from a support, enables enhanced productivity of a thin wafer, and is suited to production of a thin wafer. Another object is to provide a method of producing the wafer laminate.

The inventors have found that the above need can be fulfilled by a wafer laminate which is obtained by bonding a support and a wafer by use of a predetermined adhesive layer.

In an aspect of the present invention, there is provided a wafer laminate including a support, an adhesive layer formed on the support, and a wafer laminated so that its front surface having a circuit surface faces the adhesive layer, in which the adhesive layer includes a light-shielding resin layer A and a non-silicone thermoplastic resin-containing resin layer B in this order from the support side, the resin layer A includes a resin that contains a condensed ring in a main chain thereof, and the resin layer B has a storage elastic modulus E' at 25° C. of 1 to 500 MPa and a tensile break strength of 5 to 50 MPa.

In the wafer laminate as above, preferably, the non-silicone thermoplastic resin is a resin having a glass transition temperature of −80° C. to 120° C.

In the wafer laminate as above, preferably, the resin layer A has a transmittance of light of a wavelength of 355 nm of up to 20%.

In the wafer laminate as above, preferably, the resin layer A is composed of a cured product of a resin composition A containing a resin A that has a repeating unit represented by the following formula (1):

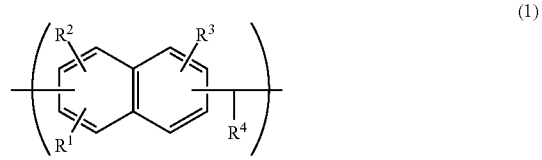

where $R^1$ to $R^3$ are each independently a hydrogen atom, a hydroxyl group, or a monovalent organic group having 1 to 20 carbon atoms, provided that at least one of $R^1$ to $R^3$ is a hydroxyl group, and $R^4$ is a hydrogen atom or a monovalent organic group having 1 to 30 carbon atoms which may have a substituent group, and a weight average molecular weight of 500 to 500,000.

In the wafer laminate as above, preferably, the resin composition A further contains a crosslinking agent.

In the wafer laminate as above, preferably, the resin composition A further contains an acid generating agent.

In the wafer laminate as above, preferably, the resin composition A further contains an organic solvent.

In another aspect of the present invention, there is provided a method of producing the wafer laminate as above, the method including the steps of:
(a) forming the resin layer A directly on the support;
(b) forming the resin layer B on a circuit formation surface of the wafer; and
(c) bonding the resin layer A and the resin layer B under a reduced pressure.

In a further aspect of the present invention, there is provided a method of producing the wafer laminate as above, the method including the steps of:
(a') forming a resin composition layer A' for forming the resin layer A directly on the support;
(b) forming the resin layer B on a circuit formation surface of the wafer;
(c) bonding the resin composition layer A' and the resin layer B under a reduced pressure; and
(d) performing heat curing to form the resin layer A and perform bonding.

In yet another aspect of the present invention, there is provided a method of producing the wafer laminate as above, the method including the steps of:
(a) forming the resin layer A directly on the support;
(b') forming the resin layer B on the resin layer A; and
(c') bonding the resin layer B over the support and a circuit formation surface of the wafer under a reduced pressure.

In a yet further aspect of the present invention, there is provided a method of producing the wafer laminate as above, the method including the steps of:
(a') forming a resin composition layer A' for forming the resin layer A directly on the support;
(b') forming the resin layer B on the resin composition layer A';
(c') bonding the resin layer B over the support and a circuit formation surface of the wafer under a reduced pressure; and
(d) performing heat curing to form the resin layer A and perform bonding.

In still another aspect of the present invention, there is provided a method of producing a thin wafer, the method including a step of grinding or polishing a non-circuit-formation surface of the wafer of the wafer laminate obtained by the method in the another aspect.

Advantageous Effects of the Invention

According to the present invention, it is possible to provide a wafer laminate which is heat resistant while supporting a support and a wafer by firmly bonding them and which permits easy separation of the wafer from the support.

BRIEF DESCRIPTION OF THE DRAWING

FIG. 1 is a schematic view depicting an example of a wafer laminate according to the present invention.

DESCRIPTION OF THE PREFERRED EMBODIMENTS

A wafer laminate according to the present invention is a wafer laminate including a support, an adhesive layer formed on the support, and a wafer laminated such that its front surface having a circuit surface faces the adhesive layer. The adhesive layer includes a light-shielding resin layer A and a non-silicone thermoplastic resin-containing resin layer B in this order from the support side.

Specifically describing the structure of the wafer laminate of the present invention, for example, as depicted in FIG. 1, a support 1 and a wafer 3 are bonded to each other through an adhesive layer 2. The adhesive layer 2 includes two layers, namely, a resin layer 2a formed in contact with the support 1, and a resin layer 2b formed in contact with the resin layer 2a.

Support

Examples of the support include a transparent substrate, a silicon wafer, and a ceramic substrate, among which the transparent substrate is preferred from the viewpoint of transmittance to laser light with which the wafer laminate is irradiated at the time of releasing the support. As the transparent substrate, normally, a glass substrate or a quartz substrate is used, and, normally, the thickness thereof is preferably 300 to 1,000 μm, more preferably 500 to 800 μM.

Wafer

The wafer is normally a semiconductor wafer. Examples of the semiconductor wafer include silicon wafers, germanium wafers, gallium-arsenic wafers, gallium-phosphorus wafers, and gallium-arsenic-aluminum wafers. The thickness of the wafer is not particularly limited; normally, the thickness is preferably 600 to 800 μm, more preferably 625 to 775 μm.

Resin Layer A

The resin layer A is a light-shielding resin layer (light-shielding layer) containing a resin having a condensed ring in a main chain thereof, and its transmittance to light of a wavelength of 355 nm is preferably up to 20%, more preferably up to 18%, and further preferably up to 15%. In addition, the resin layer A has an absorption maximum wavelength of preferably 300 to 500 nm, more preferably 300 to 400 nm. Further, the resin layer A preferably has a transmittance to light of wavelengths of 300 to 500 nm of up to 20%.

From the viewpoint of heat resistance, adhesion properties, and chemical resistance, it is preferable that the resin contained in the resin layer A is composed of a cured product of a resin composition A containing a resin A that contains a repeating unit represented by the following formula (1). As the repeating unit represented by the formula (1), only one kind of repeating unit may be contained, or at least two kinds of repeating units may be contained.

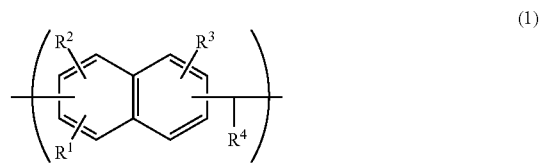

In the formula (1), $R^1$ to $R^3$ are each independently a hydrogen atom, a hydroxyl group, or a monovalent organic group having 1 to 20 carbon atoms, preferably a monovalent organic group having 1 to 10 carbon atoms, provided that at least one of $R^1$ to $R^3$ is the hydroxyl group.

Examples of the monovalent organic group include: straight, branched or cyclic alkyl groups having 1 to 20 carbon atoms such as methyl, ethyl, n-propyl, isopropyl, n-butyl, sec-butyl, tert-butyl, n-pentyl, neopentyl, n-hexyl, n-heptyl, n-octyl, n-nonyl, n-decyl, n-dodecyl, n-pentadecyl, n-eicosyl, cyclopentyl, cyclohexyl, cyclopentylmethyl, cyclohexylmethyl, cyclpentylethyl, cyclohexylethyl, cyclopentylbutyl, cyclohexylbutyl, and adamantyl; straight, branched or cyclic alkoxy groups having 1 to 5 carbon atoms such as methoxyl; epoxy-containing groups such as glycidyloxy; and aryl groups such as phenyl and naphthyl. Preferred as $R^1$ to $R^3$ are the hydrogen atom, the hydroxyl group, and the methyl group.

In the formula (1), $R^4$ is a hydrogen atom, or a monovalent organic group having 1 to 30 carbon atoms, preferably a monovalent organic group having 1 to 10 carbon atoms that may have a substituent group. Examples of the monovalent organic group represented by $R^4$ include alkyl groups, phenyl group, naphthyl group, anthracenyl group, and norbornyl group, provided that part of the hydrogen atoms of these groups may be substituted with an alkyl group, an aryl group, an aldehyde group, a halogen atom, a nitro group, a nitrile group, or a hydroxyl group.

The resin A can normally be obtained by bringing naphthol or a derivative thereof and an aldehyde compound into a polycondensation reaction in a solventless condition or in a solvent, using an acid or a base as a catalyst, at room temperature or, if necessary, with cooling or heating.

Examples of the naphthol or its derivative include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bi-2-naphthol, 6,6'-bi-2-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene. The naphthol or its derivatives may be used either singly or in combination of at least two of them.

As the aldehyde compound, there may be mentioned those represented by the following formula (2):

$$R^4\text{—CHO} \tag{2}$$

where $R^4$ is as defined above.

Examples of the aldehyde compound represented by the formula (2) include formaldehyde, trioxane, paraformaldehyde, acetaldehyde, propylaldehyde, adamantane carbaldehyde, benzaldehyde, phenylacetaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthracene carbaldehyde, pyrene carbaldehyde, furfural, methylal, phthalaldehyde, isophthalaldehyde, terephthalaldehyde, naphthalene dicarbaldehyde, anthracene dicarbaldehyde, and pyrene dicarbaldehyde. The aldehyde compounds may be used either singly or in combination of at least two of them.

Examples of the solvent for use in the polycondensation reaction include: alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran (THF), and 1,4-dioxyane; chlorine based solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and aprotic polar solvents such as dimethyl sulfoxide, N,N-dimethylforamide, and hexamethylphosphoric triamide. These solvents may be used either singly or as a mixture of at least two of them. These solvents may be used in an amount of preferably 0 to 2,000 parts by weight, more preferably 10 to 2,000 parts by weight, per 100 parts by weight in total of the naphthol or its derivative and the aldehyde compound.

Examples of the acid catalyst for use in the polycondensation reaction include: inorganic acids such as hydrochloric acid, hydrobromic acid, sulfuric acid, nitric acid, phosphoric acid, and heteropoly acid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium(IV) ethoxide, titanium(IV) isopropoxide, and titanium(IV) oxide.

Examples of the base catalyst for use in the polycondensation reaction include: inorganic bases such as sodium hydroxide, potassium hydroxide, barium hydroxide, sodium carbonate, sodium hydrogen carbonate, potassium carbonate, lithium hydride, sodium hydride, potassium hydride, and calcium hydride; alkyl metals such as methyllithium, n-butyllithium, methylmagnesium chloride, and ethylmagnesium bromide; alkoxides such as sodium methoxide, sodium ethoxide, and potassium tert-butoxide; and organic bases such as triethylamine, diisopropylethylamine, N,N-dimethylaniline, pyridine, and 4-dimethylaminopyridine.

The amount of the catalyst to be used is preferably 0.001 to 100 parts by weight, more preferably 0.005 to 50 parts by weight, per 100 parts by weight in total of the naphthol or its derivative and the aldehyde compound. The reaction temperature is preferably in the range of approximately −50° C. to the boiling point of the solvent, more preferably from room temperature to 100° C.

As the method for carrying out the polycondensation reaction, there may be mentioned a method in which the naphthol or its derivative, the aldehyde and the catalyst are simultaneously brought into reaction, and a method in which the naphthol or its derivative and the aldehyde are dropped in the presence of the catalyst.

The ratio between the amounts of the naphthol or its derivative and the aldehyde compound to be used, in terms of the molar ratio of the amount of the aldehyde compound to the total amount of the naphthol or its derivative, is preferably in the range of 0.01 to 5, more preferably in the range of 0.05 to 2, further preferably in the range of 0.05 to 1, and most preferably in the range of 0.1 to 0.9.

After the polycondensation reaction is over, in order to remove unreacted raw materials or the catalyst present in the reaction system, there may be carried out a process of raising the temperature of the reaction vessel to 130° C. to 230° C. so as to remove volatile components at a pressure of approximately 1 to 50 mmHg, a process of adding an appropriate solvent or water to the reaction system to fractionate the polymer, or a process of dissolving the polymer in a good solvent and thereafter reprecipitating the polymer in a poor solvent. These processes may be selectively used according to the properties of the reaction product obtained.

The weight average molecular weight (Mw) of the resin A is preferably 500 to 500,000, and more preferably 1,000 to 100,000. The degree of dispersion of the polymer is preferably in the range of 1.2 to 20. When the monomer components, oligomer components and low-molecular-weight components with Mw of less than 500 are cut, the amount of volatile components in baking can be suppressed, and contamination in the vicinity of a baking cup and generation of surface defects due to dropping of the volatile components can be prevented. Note that Mw in the present invention is a measured value in terms of polystyrene obtained by gel permeation chromatography (GPC) using THF as a solvent.

The resin composition. A preferably contains a crosslinking agent for crosslinking the resin A by a thermal reaction. As the crosslinking agent, there can be preferably used epoxy compounds having at least two functional groups in the molecule thereof, epoxy resins, amino resins such as methylolmelamine. Further addition of a catalyst is preferred, for accelerating the crosslinking reaction between the crosslinking agent and the polymer.

Examples of the epoxy compound and the epoxy resin include bifunctional, bifunctional, tetrafunctional, or multifunctional epoxy resins, such as EOCN-1020 (see the formula below), EOCN-102S, XD-1000, NC-2000-L, EPPN-201, GAN, NC6000 made by Nippon Kayaku Co., Ltd., and the ones represented by the following formulas.

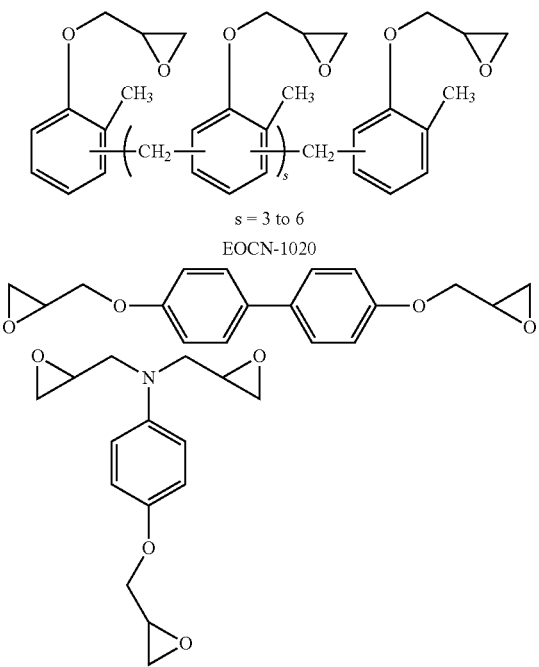

s = 3 to 6
EOCN-1020

-continued

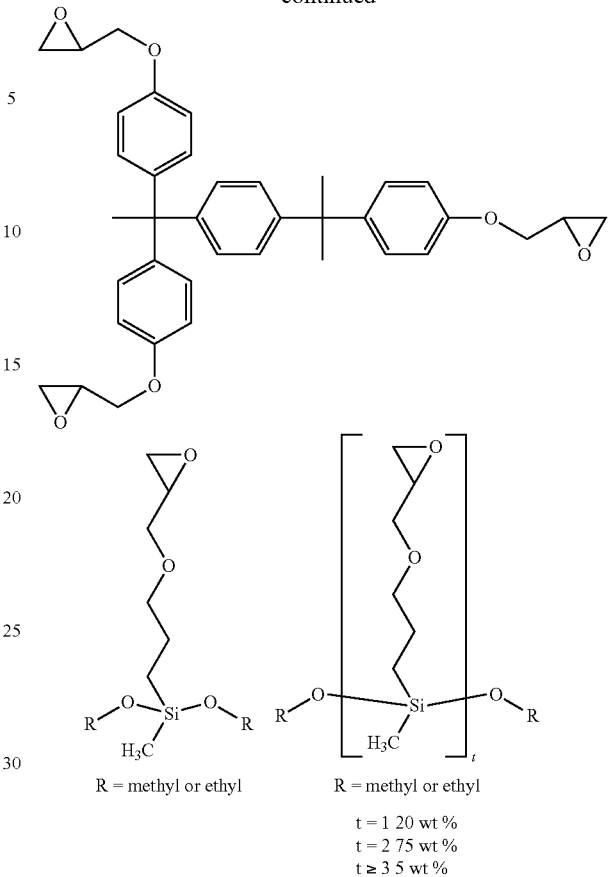

R = methyl or ethyl

R = methyl or ethyl t = 1 20 wt %
t = 2 75 wt %
t ≥ 3 5 wt %

In the case where the epoxy compound or epoxy resin is used as the crosslinking agent, the amount of the crosslinking agent is preferably 0.1 to 50 parts by weight, more preferably 0.1 to 30 parts by weight, and further preferably 1 to 30 parts by weight, per 100 parts by weight of the polymer having the repeating unit represented by the formula (1). The crosslinking agents may be used either singly or in combination of at least two of them. When the amount of the crosslinking agent is within the above-mentioned range, a sufficient crosslink density can be obtained, and the cured product obtained functions sufficiently.

Note that in the case where the epoxy resin is used as the crosslinking agent, it is preferable to add a curing accelerator as a catalyst. With an epoxy resin curing accelerator thus contained, the curing reaction can be made to proceed suitably and uniformly.

Examples of the epoxy resin curing accelerator include 2-methylimidazole, 2-ethylimidazole, 2-ethyl-4-methylimidazole, and ethylisocyanate compounds of these compounds, imidazole compounds such as 2-phenylimidazole, 2-phenyl-4-methylimidazole, 2-phenyl-4-methyl-5-hydroxymethylimidazole, and 2-phenyl-4,5-dihyroxymethylimidazole, 1,8-diazabicyclo[5.4.0]undecane-7 (DBU), 1,5-diazocyclo[4.3.0]nonene-5 (DBN), DBU compounds such as organic acid salts of DBU, phenol resin salts of DBU, and tetraphenylborates of DBU derivatives, triorganophosphines such as triphenylphosphine, tributylphosphine, tris(p-methylphenyl)phosphine, tris(p-methoxyphenyl)phosphine, tris (p-ethoxypheyl)phosphine, triphenylphosphine triphenylborate, and tetraphenylphosphine tetraphenylborate, quaternary phosphonium salts, tertiary amines such as triethyleneammonium triphenylborate, and tetraphenylborates thereof. The epoxy resin curing accelerators may be used either singly or in combination of at least two of them.

The amount of the epoxy resin curing accelerator to be used is preferably 0.1 to 10 parts by weight, more preferably 0.2 to 5 parts by weight, per 100 parts by weight of the resin A.

Besides, as the amino resin such as methylolmelamine used in the present invention, there may be mentioned at least one compound selected from the group consisting of amino condensates modified with formalin or formalin-alcohol, and phenol compounds having an average of at least two methylol groups or alkoxymethylol groups in the molecule thereof.

The amino resin preferably has an Mw of 150 to 10,000, more preferably 200 to 3,000. When the Mw of the amino resin is in this range, sufficient curing properties can be obtained, and the heat resistance after the curing of the composition is good.

As the amino condensate modified with formalin or formalin-alcohol, there may be mentioned melamine condensates modified with formalin or formalin-alcohol, and urea condensates modified with formalin or formalin-alcohol.

The melamine condensate modified with formalin or formalin-alcohol can be prepared, for example, by modifying a melamine monomer by methylol formation with formalin according to a known method, or by further modifying the product by alkoxylation with an alcohol, to thereby form a modified melamine represented by the following formula. Note that preferred as the alcohol is a lower alcohol, for example, alcohol having 1 to 4 carbon atoms.

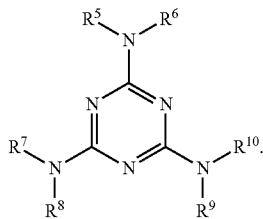

In the formula, $R^5$ to $R^{10}$ are each independently a methylol group, an alkoxymethyl group containing a straight, branched or cyclic alkoxyl group having 1 to 4 carbon atoms, or a hydrogen atom, provided that at least one of $R^5$ to $R^{10}$ is the methylol group or the alkoxymethyl group.

Examples of the modified melamine include trimethoxymethyl monomethylolmelamine, dimethoxymethyl monomethylolmelamine, trimethylolmelamine, hexamethylolmelamine, and hexamethoxymethylolmelamine. Next, the modified melamine or an oligomer (e.g., a dimer or a trimer) obtained therefrom is brought to addition condensation polymerization with formaldehyde until a desired molecular weight is reached by an ordinary method, whereby a melamine condensate modified with formalin or formalin-alcohol is obtained. Note that at least one modified melamine condensate of the modified melamine and condensates thereof can be used as a crosslinking agent.

In addition, the urea condensate modified with formalin or formalin-alcohol can be prepared, for example, by modifying a urea condensate having a desired molecular weight by methylol formation with formalin according to a known method, or by further modifying the modified urea condensate by alkoxylation with an alcohol.

Examples of the modified urea condensate include methoxymethylated urea condensates, ethoxymethylated urea condensates, and propoxymethylated urea condensates. Note that at least one of these modified urea condensates can be used.

Among these, as a phenol compound having an average of at least two methylol groups or alkoxymethylol groups in one molecule thereof, there may be mentioned, for example, (2-hydroxy-5-methyl)-1,3-benzenedimethanol, and 2,2',6,6'-tetramethoxymethylbisphenol A.

These amino condensates or phenol compounds may be used either singly or in combination of at least two of them.

The amount of the crosslinking agent to be used is preferably 0.1 to 50 parts by weight, more preferably 1 to 30 parts by weight, per 100 parts by weight of the resin A. When the amount of the crosslinking agent is within this range, the composition A is cured sufficiently, and the cured product obtained functions sufficiently.

Note that in the case where the amino resin such as methylolmelamine is used as the crosslinking agent, it is preferable to add a thermal acid generator as a catalyst. The thermal acid generator is not specifically restricted, and may be, for example, ammonium salts represented by the following formula:

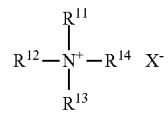

where $R^{11}$ to $R^{14}$ are each independently a hydrogen atom, a straight, branched or cyclic alkyl group or oxoalkyl group having 1 to 12 carbon atoms, a straight, branched or cyclic alkenyl group or oxoalkenyl group having 2 to 12 carbon atoms, an aryl group having 6 to 20 carbon atoms, or an aralkyl group or aryloxoalkyl group having 7 to 12 carbon atoms, provide that part of the hydrogen atoms of these groups may be substituted by an alkoxyl group. Two selected from $R^{11}$ to $R^{14}$ may form a ring together with a nitrogen atom bonded to them, the ring being an aliphatic ring having 3 to 10 carbon atoms having the nitrogen atom in the formula in the ring, or a heteroaromatic ring having 5 to 10 carbon atoms having the nitrogen atom in the ring. $X^-$ is a sulfonic acid in which at least one of α-positions is fluoro-substituted, or perfluoroalkylimidic acid or perfluoroalkylmethide acid.

Specific examples of $X^-$ include perfluoroalkanesulfonic acid anion such as triflate anion and nonaflate anion; sulfonate anion in which at least one of α-position is fluoro-substituted; imide anions such as bis(trifluoromethylsulfonyl)imide anion, bis(perfluoroethylsulfonyl)imide anion, and bis(perfluorobutylsulfonyl)imide anion; and methanide anions such as tris(trifluoromethylsulfonyl)methanide anion and tris(perfluoroethylsulfonyl)methanide anion.

The amount of the thermal acid generator to be used is preferably 0.1 to 15 parts by weight, more preferably 0.2 to 10 parts by weight, per 100 parts by weight of the resin A. When the amount of the thermal acid generator is in this range, the composition A is cured sufficiently, and the composition A is good in storage stability.

The resin composition A may contain a solvent. Examples of the solvent include: ketones such as cyclohexanone, cyclopentanone, and methyl 2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, ethyl 3-methoxypropionate, ethyl 3-ethoxypropionate, tert-butyl acetate, tert-butyl propionate, propylene glycol mono-tert-butyl ether acetate, and γ-butyrolactone. These may be used either singly or as a mixture of at least two of them. The amount of the solvent to be used is preferably 100 to 5,000 parts by weight, more preferably 150 to 2,500 parts by weight, per 100 parts by weight of the resin A.

Besides, the resin composition A can also be used as a film-shaped composition containing no solvent.

If necessary, the resin composition A may contain a surfactant and/or an antioxidant for the purpose of further enhancing heat resistance.

The surfactant is not particularly limited. Examples of the surfactant include: nonionic surfactants such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenyl ether and polyoxyethylene nonyl phenyl ether; polyoxyethylene polyoxypropylene block copolymers; sorbitan fatty acid esters such as sorbitan monolaurate, sorbitan monopalmitate, and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluro-surfactants such as EFTOP™ EF301, EF303, EF352 (made by Tochem Products Co., Ltd.), MEGAFACE™ F171, F172, F173 (made by DIC Corporation), FLUORAD™ FC430, FC431 (made by 3M Company), ASAHI GUARD AG710, SURFLON™ S-381, S-382, SC101, SC102, SC103, SC104, SC105, SC106, SURFINOL™ E1004, KH-10, KH-20, KH-30, KH-40 (made by Asahi Glass Co., Ltd.); organosiloxane polymers KP341, X-70-092, X-70-093, X-70-1102 (made by Shin-Etsu Chemical Co., Ltd.), and acrylic acid based or methacrylic acid based POLYFLOW No. 75, No. 95 (made by Kyoeisha Chemical Co., Ltd.). These may be used either singly or in combination of at least two of them.

The antioxidant is preferably at least one selected from hindered phenol based compounds, hindered amine based compounds, organic phosphorus compounds, and organic sulfur compounds.

The hindered phenol based compounds are not specifically restricted, and preferable examples thereof include 1,3,5-trimethyl-2,4,6-tris(3,5-di-tert-butyl-4-hydroxybenzyl)benzene (trade name: IRGANOX 1330), 2,6-di-tert-butyl-4-methylphenol (trade name: Sumilizer BHT), 2,5-di-text-butyl-hydroquinone (trade name: Nocrac NS-7), 2,6-di-tert-butyl-4-ethylphenol (trade name: Nocrac M-17), 2,5-di-tert-amylhydroquinone (trade name: Nocrac DAH), 2,2'-methylenebis(4-methyl-6-tert-butylphenol) (trade name: Nocrac NS-6), 3,5-di-tert-butyl-4-hydroxy-benzylphosphonate-diethyl ester (trade name: IRGANOX 1222), 4,4'-thio-bis(3-methyl-6-tert-butylphenol) (trade name: Nocrac 300), 2,2'-methylenebis(4-ethyl-6-tert-butylphenol) (trade name: Nocrac NS-5), 4,4'-butylidenebis(3-methyl-6-tert-butylphenol) (trade name: Adkstab AO-40), 2-tert-butyl-6-(3-tert-butyl-2-hydroxy-5-methylbenzyl)-4-methylphenyl acrylate (trade name: Sumilizer GM), 2-[1-(2-hydroxy-3,5-di-tert-pentylphenyl)ethyl]-4,6-di-tert-pentylphenyl acrylate (trade name: Sumilizer GS), 2,2'-methylenebis[4-methyl-6-(α-methyl-cyclohexyl)phenol], 4,4'-methylenebis(2,6-di-tert-butylphenol) (trade name: SEENOX 226M), 4,6-bis(octylthiomethyl)-o-cresol (trade name: IRGANOX 1520L), 2,2'-ethylenebis(4,6-di-tert-butylphenol), octadecyl-3-(3,5-di-tert-butyl-4-hydroxyphenyl)propionate (trade name: IRGANOX 1076), 1,1,3-tris-(2-methyl-4-hydroxy-5-tert-butylphenyl)butane (trade name: Adkstab AO-30), tetrakis[methylene-(3,5-di-tert-butyl-4-hydroxyhydrocinnamate)]methane (trade name: Adkstab AO-60), triethylene glycol bis[3-(3-tert-butyl-5-methyl-4-hydroxyphenyl)-propionate] (trade name: IRGANOX 245), 2,4-bis-(n-octylthio)-6-(4-hydroxy-3,5-di-tert-butylanilino)-1,3,5-triazine (trade name: IRGANOX 565), N,N'-hexamethylenebis(3,5-di-tort-butyl-4-hydroxy-hydrocinnamamide) (trade name: IRGANOX 1098), 1,6-hexanediol-bis[3-(3,5-di-tert-butyl-4-hydroxyphenyl)propionate] (trade name: IRGANOX 259), 2,2-thio-diethylenebis[3-(3,5-di-tert-butyl-4-hydroxyphenyl)propionate] (trade name: IRGANOX 1035), 3,9-bis[2-[3-(3-tert-butyl-4-hydrocy-5-methylpohenyl)propionyloxy]1,1-dimethylethyl]2,4,8,10-tetraoxaspiro[5.5]undecane (trade name: Sumilizer GA-80), tris-(3,5-di-tert-butyl-4-hydroxybenzyl) isocyanurate (trade name: IRGANOX 3114), bis(3,5-di-tert-butyl-4-hydroxybenzyl ethyl phosphonate) calcium/polyethylene wax mixture (50:50) (trade name: IRGANOX 1425WL), isooctyl-3-(3,5-di-tert-butyl-4-hydroxyphenyl)-propionate (trade name: IRGANOX 1135), 4,4'-thiobis(6-tert-butyl-3-methylphenol) (trade name: Sumilizer WX-R), and 6-[3-(3-tert-butyl-4-hydroxy-5-methylphenyl)propoxyl]-2,4,8,10-tetra-tert-butyldibenz[d,f][1,3,2]dioxaphosphepine (trade name: Sumilizer GP).

The hindered amine based compounds are not specifically restricted, and preferable examples thereof include p,p'-dioctyldiphenylamine (trade name: IRGANOX 5057), phenyl-α-naphthylamine (trade name: Nocrac PA), poly(2,2,4-trimethyl-1,2-dihyroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphthyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'-(α,α-dimethylbenzyl)diphenylamine (trade name: Nocrac CD), p,p-toluenesulfonylaminodiphenylamine (trade name: Nocrac TD), N-phenyl-N'-(3-methachloryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), dimethyl-1-(2-hydoxyethyl)-4-hydroxy-2,2,6,6-tetramethylpiperidine succinate polycondensate (trade name: Tinuvin 622LD), poly[[6-(1,1,3,3-tetramethylbutyl)amino-1,3,5-triazin-2,4-diyl][(2,2,6,6-tetrametyl-4-piperizyl)imino]hexamethylene[(2,2,6,6-tetramethyl-4-piperidyl)imino]] (trade name: CHIMASSORB 944), N,N'-bis(3-aminopropyl)ethylenediamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl) sebacate (trade name: TINUVIN 123), bis(2,2,6,6-tetramethyl-4-piperidyl) sebacate (trade name: TINUVIN 770), bis(1,2,2,6,6-pentamethyl-4-piperidyl) 2-(3,5-di-tert-butyl-4-hydroxybenzyl)-2-n-butylmalonate (trade name: TINUVIN 144), bis(1,2,2,6,6-pentamethyl-4-piperidyl) sebacate (trade name: TINUVIN 765), tetrakis(1,2,2,6,6-pentamethyl-4-piperidyl)

1,2,3,4-butanetetracarboxylate (trade name: LA-57), tetrakis (2,2,6,6-tetramethyl-4-piperidyl) 1,2,3,4-butanetetracarboxylate (trade name: LA-52), a mixed esterified product of 1,2,3,4-butanetetracarboxylic acid and 1,2,2,6,6-pentamethyl-4-piperidinol and 1-tridecanol (trade name: LA-62), a mixed esterified product of 1,2,3,4-butanetetracarboxylic acid and 2,2,6,6-tetramethyl-4-piperidinol and 1-tridecanol (trade name: LA-67), a mixed esterified product of 1,2,3,4-butanetetracarboxylic acid and 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), a mixed esterified product of 1,2,3,4-butanetetracarboxylic acid and 2,2,6,6-tetramethyl-4-piperidinol and 3,9-bis(2-hydroxy-1,1-dimethylethyl)-2,4,8,10-tetraoxaspiro[5.5]undecane (trade name: LA-68LD), (2,2,6,6-tetramethylene-4-piperidyl)-2-propylenecarboxylate (trade name: Adkstab LA-82), and (1,2,2,6,6-pentamethyl-4-piperidyl)-2-propylenecarboxylate (trade name: Adkstab LA-87).

The organic phosphorus compound is not particularly restricted, and preferable examples thereof include bis(2,4-di-tert-butylphenyl)[1,1-biphenyl]-4,4'-diyl bisphosphite, 9,10-dihydro-9-oxa-10-phosphaphenanthrene-10-oxide (trade name: SANKO-HCA), triethyl phosphite (trade name: JP302), tri-n-butyl phosphite (trade name: JP304), triphenyl phosphite (trade name: Adkstab TPP), diphenyl monooctyl phosphite (trade name: Adkstab C), tri(p-cresyl) phosphite (trade name: Chelex-PC), diphenyl monodecyl phosphite (trade name: Adkstab 135A), diphenyl mono(tridecyl) phosphite (trade name: JPM313), tris(2-ethylhexyl) phosphite (trade name: JP308), phenyl decyl phosphite (trade name: Adkstab 517), tridecyl phosphite (trade name: Adkstab 3010), tetraphenyl dipropylene glycol diphosphite (trade name: JPP100), bis(2,4-di-tert-butylphenyl)pentaerythritol diphosphite (trade name: Adkstab PEP-24G), tris(tridecyl) phosphite (trade name: JP333E), bis(nonylphenyl)pentaerythritol diphosphite (trade name: Adkstab PEP-4C), bis (2,6-di-tert-butyl-4-methylphenyl)pentaerythritol diphosphite (trade name: Adkstab PEP-36), bis[2,4-di(1-phenylisopropyl)phenyl]pentaerythritol diphosphite (trade name: Adkstab PEP-45), trilauryl trithio phosphite (trade name: JPS312), tris(2,4-di-tert-butylphenyl) phosphite (trade name: IRGAFOS 168), tris(nonylphenyl) phosphite (trade name: Adkstab 1178), distearyl pentaerythritol diphosphite (trade name: Adkstab PEP-8), tris(mono, dinonylphenyl) phosphite (trade name: Adehkastab 329K), trioleyl phosphite (trade name: Chelex-OL), tristearyl phosphite (trade name: JP318E), 4,4'-butylidenebis(3-methyl-6-tert-butylphenylditridecyl) phosphite (trade name: JPH1200), tetra(mixed alkyl having 12 to 15 carbon atoms)-4,4'-isopropylidene diphenyl diphosphite (trade name: Adkstab 1500), tetra(tridecyl)-4,4'-butylidenebis(3-methyl-6-tert-butylphenol) diphosphite (trade name: Adkstab 260), hexa (tridecyl)-1,1,3-tris(2-methyl-5-tert-butyl-4-hydroxyphenyl)butane-triphosphite (trade name: Adkstab 522A), a hydrogenated bisphenol A phosphite polymer (HBP), tetrakis(2,4-di-tert-butylphenyloxy) 4,4'-biphenylene-di-phosphine (trade name: P-EPQ), tetrakis(2,4-di-tert-butyl-5-methylpohenyloxy) 4,4'-biphenylene-di-phosphine (trade name: GSY-101P), 2-[[2,4,8,10-tetrakis(1,1-dimethylethyl) dibenzo[d,f][1,3,2]dioxa-phosphepin-6-yl]oxy]-N,N-bis[2-[[2,4,8,10-tetrakis(1,1-dimethylethyl)dibenzo[d,f][1,3,2]-dioxaphosphepin-6-yl]oxy]-ethyl]ethanamine (trade name: IRGAFOS 12), and 2,2'-methylenebis(4,6-di-tert-butylphenyl)octyl phosphite (trade name: Adkstab HP-10).

The organic sulfur compound is not specifically restricted, and preferable examples thereof include dilauryl 3,3'-thiodipropionate (trade name: Sumilizer TPL-R), dimyristyl 3,3'-thiodipropionate (trade name: Sumilizer TPM), distearyl 3,3'-thiodipropionate (trade name: Sumilizer TPS), pentaerythritol tetrakis(3-lauryl thiopropionate) (trade name: Sumilizer TP-D), ditridecyl 3,3'-thiodipropionate (trade name: Sumilizer TL), 2-mercaptobenzimidazole (trade name: Sumilizer MB), ditridecyl-3,3'-thiodipropionate (trade name: Adkstab AO-503A), 1,3,5-tris-β-stearyl-thiopropionyloxyethyl isocyanurate, 3,3'-thiobispropionic acid didodecyl ester (trade name: IRGANOX PS 800FL), and 3,3'-thiobispropionic acid dioctadecyl ester (trade name: IRGANOX PS 802FL).

Among the above-mentioned antioxidants, particularly preferred is tetrakis[methylene-(3,5-di-tert-butyl-4-hydroxyhydrocinnamate)]methane. The amount of the antioxidant to be added is preferably 0.5 to 5 parts by weight, more preferably 1 to 3 parts by weight, per 100 parts by weight of the resin A. When the amount of the antioxidant is in this range, a sufficient heat resisting effect can be obtained, and compatibility can also be obtained. Note that the antioxidants may be used either singly or in combination of at least two of them.

Besides, for further enhancing heat resistance, a known filler such as silica may be added to the resin composition A in an amount of up to 50 parts by weight, per 100 parts by weight of the resin A.

In the case where the resin composition A is a liquid, the resin composition A is applied to a support by such a method as spin coating, roll coating, die coating, printing, or dipping, then prebaking is conducted at a temperature of preferably 80° C. to 200° C., more preferably 100° C. to 180° C., according to volatilization conditions of the solvent, to volatilize the solvent, whereby a resin composition layer A' is formed.

On the other hand, in the case where the resin composition A is a film-shaped composition, a resin composition layer A' can be formed on a support by a lamination method.

The resin composition layer A' formed on the support functions as the resin layer A, by being further cured by heating. The curing by heating can be carried out using a hot plate or an oven, the heating condition being normally at 100° C. to 350° C. for five to ten minutes, preferably at 150° C. to 300° C. for three to eight minutes. The curing reaction can also be achieved by a method in which a wafer laminate in an uncured state is formed without curing the resin composition layer A', and thereafter the laminate as a whole is heated.

The thickness of the resin layer A formed on the support is preferably 0.1 to 50 μm, more preferably 0.3 to 30 μm. When the thickness of the resin layer A is in this range, a sufficient light-shielding property is obtained, and flatness of the film is good.

Resin Layer B

The resin layer B has a storage elastic modulus E' at 25° C. of 1 to 500 MPa, and a tensile break strength of 5 to 50 MPa. If E' is less than 1 MPa, wafer exfoliation may be generated at the time of grinding the back side of the wafer. If E' exceeds 500 MPa, on the other hand, cracks may be generated on the front side of the resin layer B, and back grinding property of the wafer in the laminate may be worsened. If the tensile break strength is less than 5 MPa, wafer exfoliation may occur at the time of back grinding of the wafer. If the tensile break strength exceeds 50 MPa, rigidity is so high that many defects are generated and that adhesion properties cannot be obtained.

The E' is preferably 5 to 300 MPa, more preferably 5 to 100 MPa, and further preferably 10 to 80 MPa. The tensile break strength of the resin layer B is preferably 10 to 50

MPa. When such a temporary adhesive material for wafer processing is used, it is ensured that wafer exfoliation and/or wafer cracking is less liable to occur at the time of back grinding of the wafer, so that the wafer can be processed more stably.

In the present invention, the storage elastic modulus E' can be measured by use of a known dynamic viscoelasticity measuring apparatus, and the tensile break strength can be measured by use of a known tensile tester.

The resin layer B contains a thermoplastic resin (non-silicone thermoplastic resin) having no siloxane skeleton. From the viewpoint of applicability to a stepped silicon wafer or the like, a non-silicone thermoplastic resin having a good spin coating property is particularly preferred as a material for forming the thermoplastic resin layer. As such a non-silicone thermoplastic resin, a non-silicone thermoplastic resin having a glass transition temperature of approximately −80° C. to 120° C. is particularly preferable, and its Mw is preferably 20,000 to 200,000, more preferably 30,000 to 150,000. Note that Tg in the present invention can be measured by use of a known dynamic viscoelasticity measuring apparatus.

Examples of the non-silicone thermoplastic resin include non-silicone thermoplastic elastomers such as polyolefin thermoplastic elastomers, polybutadiene thermoplastic elastomers, polystyrene thermoplastic elastomers, polystyrene-butadiene thermoplastic elastomers, and polystyrene-olefin thermoplastic elastomers, and hydrogenated polystyrene elastomers having excellent heat resistance are particularly preferable. Specific examples include Tuftex™ (made by Asahi Kasei Chemicals Corporation), ESPOLEX™ SB series (made by Sumitomo Chemical Co., Ltd.), RABALON™ (made by Mitsubishi Chemical Corporation), SEPTON™ (made by Kuraray Co., Ltd), and DYNARON™ (made by JSR Corporation). In addition, examples of the non-silicone thermoplastic resin include cycloolefin copolymers represented by ZEONEX™ (made by Zeon Corporation) and cyclic olefin copolymers represented by TOPAS™ (made by Topas Advanced Polymers GmbH).

The non-silicone thermoplastic resin is preferably a non-silicone thermoplastic elastomer. A composite temporary adhesive layer having a layer containing a non-silicone thermoplastic elastomer permits, after the formation of a thin wafer, easy peeling of the wafer from the support, so that the thin wafer susceptible to cracking can be handled more easily.

The resin layer B is preferably composed of a cured product of a resin composition B containing the non-silicone thermoplastic resin.

The resin composition B may contain an antioxidant for the purpose of enhancing heat resistance, and may contain a surfactant for enhancing coating properties. Examples of the antioxidant include di-tert-butylphenol. Examples of the surfactant include fluorosilicone surfactant X-70-1102 (made by Shin-Etsu Chemical Co., Ltd.).

The resin composition B may contain a solvent. Examples of the solvent include hydrocarbon solvents, preferably, nonane, p-menthane, pinene, isooctane, toluene, xylene, and mesitylene among which nonane, p-menthane, isooctane, and mesitylene are more preferred from the viewpoint of coating properties. The solvents may be used either singly or as a mixture of at least two of them. The amount of the solvent to be used is preferably 250 to 3,500 parts by weight, more preferably 300 to 2,000 parts by weight, per 100 parts by weight of the resin B.

Besides, the resin composition B can also be used as a film-shaped composition containing no solvent.

In the case where the resin composition B is a solution, the resin layer B can be formed by applying the resin composition B to a wafer by such a method as spin coating, roll coating, die coating, printing, or dipping, followed by heating by use of a hot plate or an oven. In this case, the heating condition is normally at 100° C. to 200° C. for one to ten minutes, preferably at 130° C. to 190° C. for two to five minutes.

In the case where the resin composition B is a film-shaped composition, the resin layer B can be formed on a wafer by a lamination method.

The thickness of the resin layer B is preferably 1 to 70 μm, more preferably 2 to 50 μm. When the thickness of the resin layer B is in this range, the fear of remaining of the solvent due to insufficient heating is eliminated, and the steps on the wafer can be uniformly covered at the time of bonding.

Method of Producing Wafer Laminate

The method of producing a wafer laminate of the present invention includes the following steps (a) to (d).

Step (a) or (a')

Step (a) is a step of forming a light-shielding resin layer A on a support, and step (a') is a step of forming a resin composition layer A' on the support. In the case where the resin composition A for forming the resin layer A is a solution, the solution is applied to the support by such a method as spin coating or roll coating, and prebaking is conducted at a temperature of preferably 80° C. to 200° C., more preferably 100° C. to 180° C. according to volatilization conditions of the solvent, to volatilize the solvent, whereby the resin composition layer A' is formed. In the case where the resin composition A is a film-shaped composition, the resin composition layer A' is formed on the support by a lamination method.

The resin composition layer A' formed on the support can function as the resin layer A, by being cured by heating. The curing by heating can be carried out by use of a hot plate or an oven, and the temperature in this case is normally 100° C. to 350° C., preferably 150° C. to 300° C. The curing time is normally one to ten minutes, preferably two to eight minutes. The curing reaction can also be achieved by a method in which a wafer laminate in an uncured state is formed without curing the resin composition layer A', and thereafter the laminate as a whole is heated.

Step (b) or (b')

Step (b) is a step of forming a resin layer B on a circuit formation surface of a wafer, and step (b') is a step of forming a resin layer B on the resin layer A or the resin composition layer A'. In the case where the resin composition B is a solution, the solution is applied to the wafer by such a method as spin coating, roll coating, die coating, printing, or dipping, and thereafter heating is conducted at 130° C. to 190° C. by use of a hot plate or an oven, whereby the resin layer B can be formed.

In the case where the resin composition B is a film-shaped composition, on the other hand, the resin layer B can be formed on the wafer by a lamination method.

Step (c) or (c')

Step (c) is a step of bonding the resin layer A or the resin composition layer A' and the resin layer B to each other under a reduced pressure, and step (c') is a step of bonding the resin layer B on the support and the circuit formation surface of the wafer to each other under a reduced pressure. The reduced pressure is preferably 0.1 to 100 Pa, more preferably 1 to 80 Pa. In this instance, it is recommendable to uniformly press and bond the substrate under the reduced pressure in a temperature range of preferably 40° C. to 240° C., more preferably 60° C. to 220° C.

Step (d)

Step (d) is a step of heat curing the resin composition layer A' of the wafer laminate bonded in the step (c) or (c'), to form the resin layer A and bond it to the resin layer B. The heat curing is conducted, after the formation of the wafer laminate, by heating at a temperature of 120° C. to 260° C., preferably 150° C. to 250° C., for one minute to foul bouts, preferably three minutes to two hours.

In this way, by combining the support, the adhesive layer, and the substrate provided on a front surface thereof with circuits, a wafer laminate can be obtained.

Method of Producing Thin Wafer

Of the wafer laminate obtained by the above-mentioned method, the non-circuit-formation surface of the wafer is ground, whereby a thin wafer can be produced.

Next, the non-circuit-formation surface of the wafer laminate thinned by the back side grinding is subjected to processing, whereby a thin wafer laminate can be produced. In this processing step, various processes ordinarily used on a wafer level are included. Examples of the processes include electrode formation, metal wiring formation, and protective film formation. More specifically, the processes include conventionally known processes such as metal sputtering for formation of electrodes, wet etching for etching the metal sputtered layer, formation of a pattern by application, exposure, and development of a resist for forming a mask for formation of metal wiring, peeling of the resist, dry etching, formation of metal plating, silicon etching for TSV formation, and formation of an oxide film on silicon surface.

The thin wafer laminate can undergo peeling of the wafer from the support by irradiation with laser light having a wavelength of 355 nm, for example.

EXAMPLES

The present invention will be described more in detail below by depicting Preparation Examples, Examples, and Comparative Examples, but the present invention is not limited to these Examples. In the following description, parts means parts by weight. The weight average molecular weight (Mw) is a measured value in terms of polystyrene obtained by GPC using THF as a solvent. Besides, the acid generator AG used in the following Examples is as follows.

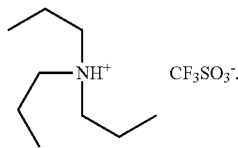

[1] Preparation of Resin Composition

Preparation Example 1

To a 1,000 mL flask, there were added 80 g (0.50 mol) of 1,5-dihydroxynaphthalene, 51.6 g (0.30 mol) of 2-hydroxy-6-naphthaldehyde, and 145 g of methyl cellosolve, and, while stirring the contents of the flask at 70° C., 20 g of a 20 wt % solution of paratoluenesulfonic acid in methyl cellosolve was added thereto. The temperature was raised to 85° C., and stirring was conducted for six hours, followed by cooling to room temperature and dilution with 800 mL of ethyl acetate. The contents of the flask was transferred into a separatory funnel, and washing with 200 mL of deionized water was repeated, to remove the reaction catalyst and metallic impurities. The solution obtained was concentrated under a reduced pressure, after which 600 mL of ethyl acetate was added to the residue, and a polymer was precipitated using 2,400 mL of hexane. The precipitated polymer was filtered, recovered, and dried under a reduced pressure, to obtain a resin A1 containing a repeating unit represented by the following formula. The resin A1 had an Mw of 3,200 and a degree of dispersion (Mw/Mn) of 2.44.

In 100 parts of PGMEA containing 0.1 wt % of FC-4430 (made by 3M Company), there were dissolved 20 parts of the resin A1, 1 part of the acid generator AG, and 4 parts of NIKALAC Mw390 (made by Sanwa Chemical Co., Ltd.) as a crosslinking agent, and the solution was filtered using a fluororesin-made filter having a pore size of 0.1 μm, to obtain a resin composition A1.

Besides, a composition in which the amount of PGMEA in the resin solution A1 was changed to 35 parts was also prepared, and was filtered by a fluororesin-made filter having a pore size of 0.1 μm, to obtain a resin composition A1'.

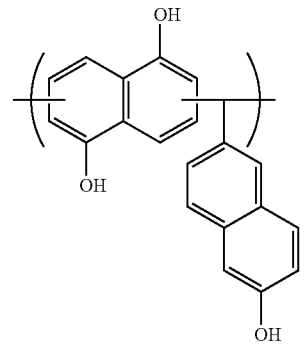

Preparation Example 2

To a 1,000 mL flask, there were added 80 g (0.50 mol) of 1,5-dihydroxynaphthalene, 9.0 g (0.30 mol) of paraformaldehyde, and 145 g of methyl cellosolve, and, while stirring the contents of the flask at 70° C., 20 g of a 20 wt % solution of paratoluenesulfonic acid in methyl cellosolve was added thereto. The temperature was raised to 85° C., and stirring was conducted for six hours, followed by cooling to room temperature and dilution with 800 mL of ethyl acetate. The contents of the flask was transferred into a separatory funnel, and washing with 200 mL of deionized water was repeated, to remove the reaction catalyst and metallic impurities. The solution obtained was concentrated under a reduced pressure, after which 600 mL of ethyl acetate was added to the residue, and a polymer was precipitated using 2,400 mL of hexane. The precipitated polymer was filtered, recovered, and dried under a reduced pressure, to obtain a resin A2 containing a repeating unit represented by the following formula. The resin A2 had an Mw of 1,500 and an Mw/Mn of 2.20.

In 100 parts of PGMEA containing 0.1 wt % of FC-4430 (made by 3M Company), there were dissolved 20 parts of the resin A2, 1 part of the acid generator AG, and 4 parts of NIKALAC Mw390 (made by Sanwa Chemical Co., Ltd.) as a crosslinking agent, and the solution was filtered using a fluororesin-made filter having a pore size of 0.1 μm, to obtain a resin composition A2.

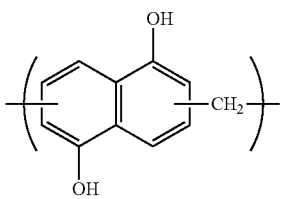

Preparation Example 3

To a 1,000 mL flask, there were added 72 g (0.50 mol) of 1-hydroxynaphthalene, 51.6 g (0.30 mol) of 2-hydroxy-6-naphthaldehyde, and 145 g of methyl cellosolve, and, while stirring the contents of the flask at 70° C., 20 g of a 20 wt % solution of paratoluenesulfonic acid in methyl cellosolve was added thereto. The temperature was raised to 85° C., and stirring was conducted for six hours, followed by cooling to room temperature and dilution with 800 mL of ethyl acetate. The contents of the flask was transferred into a separatory funnel, and washing with 200 mL of deionized water was repeated, to remove the reaction catalyst and metallic impurities. The solution obtained was concentrated under a reduced pressure, after which 600 mL of ethyl acetate was added to the residue, and a polymer was precipitated using 2,400 mL of hexane. The precipitated polymer was filtered, recovered, and dried under a reduced pressure, to obtain a resin A3 containing a repeating unit represented by the following formula. The resin A3 had an Mw of 2,700 and an Mw/Mn of 2.61.

In 100 parts of PGMEA containing 0.1 wt % of FC-4430 (made by 3M Company), there were dissolved 20 parts of the resin A3, 1 part of the acid generator AG, and 4 parts of NIKALAC Mw390 (made by Sanwa Chemical Co., Ltd.) as a crosslinking agent, and the solution was filtered using a fluororesin-made filter having a pore size of 0.1 µm, to obtain a resin composition A3.

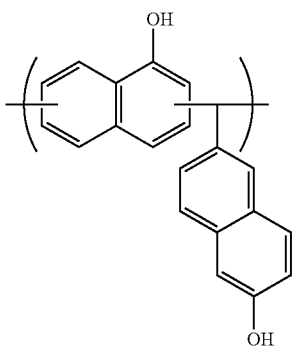

Comparative Preparation Example 1

To a 1,000 mL flask, there were added 32.4 g (0.30 mol) of 2-methylhydroxybenzene, 51.6 g (0.30 mol) of 2-hydroxy-6-naphthaldehyde, and 145 g of methyl cellosolve, and, while stirring the contents of the flask at 70° C., 20 g of a 20 wt % solution of paratoluenesulfonic acid in methyl cellosolve was added thereto. The temperature was raised to 85° C., and stirring was conducted for six hours, followed by cooling to room temperature and dilution with 800 mL of ethyl acetate. The contents of the flask was transferred into a separatory funnel, and washing with 200 mL of deionized water was repeated, to remove the reaction catalyst and metallic impurities. The solution obtained was concentrated under a reduced pressure, after which 600 mL of ethyl acetate was added to the residue, and a polymer was precipitated using 2,400 mL of hexane. The precipitated polymer was filtered, recovered, and dried under a reduced pressure, to obtain a resin A4 containing a repeating unit represented by the following formula. The resin A4 had an Mw of 2,100 and an Mw/Mn of 1.58.

In 100 parts of PGMEA containing 0.1 wt % of FC-4430 (made by 3M Company), there were dissolved 20 parts of the resin A4, 1 part of the acid generator AG, and 4 parts of NIKALAC Mw390 (made by Sanwa Chemical Co., Ltd.) as a crosslinking agent, and the solution was filtered using a fluororesin-made filter having a pore size of 0.1 µm, to obtain a resin composition A4.

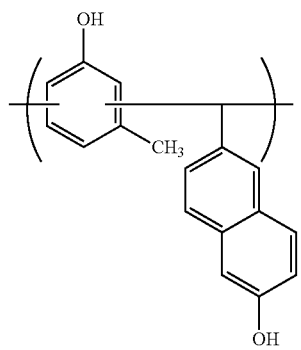

Preparation Example 4

In 150 g of mesitylene, there were dissolved 25 g a hydrogenated polystyrene thermoplastic resin SEPTON 4033 (a polystyrene-poly(ethylene/propylene) block-polystyrene copolymer made by Kuraray Co., Ltd.; styrene content: 30 wt %) and 25 g of a hydrogenated polystyrene thermoplastic resin SEPTON 8076 (a polystyrene-poly(ethylene/propylene) block-polystyrene copolymer made by Kuraray Co., Ltd.; styrene content: 30 wt %), to obtain a 25 wt % solution of SEPTON 4033/8076 in mesitylene. The solution thus obtained was filtered using a 0.2 µm membrane filter, to obtain a resin composition B1. In addition, the glass transition temperature (Tg) of the resin was measured to be 111° C.

Preparation Example 5

In 150 g of mesitylene, there were dissolved 25 g of a hydrogenated polystyrene thermoplastic resin SEPTON 4033 (a polystyrene-poly(ethylene/propylene) block-polystyrene copolymer made by Kuraray Co., Ltd.; styrene content: 30 wt %) and 25 g of a hydrogenated polystyrene thermoplastic resin SEPTON 2002 (a polystyrene-poly(ethylene/propylene) block-polystyrene copolymer made by Kuraray Co., Ltd.; styrene content: 30 wt %), to obtain a 25 wt % solution of SEPTON 4033/2002 in mesitylene. The solution thus obtained was filtered using a 0.2 µm membrane filter, to obtain a resin composition B2. Besides, the Tg of the resin was measured to be 96° C.

Preparation Example 6

In 160 g of mesitylene, there were dissolved 20 g of a hydrogenated polystyrene thermoplastic resin SEPTON 4033 (a polystyrene-poly(ethylene/propylene) block-polystyrene copolymer made by Kuraray Co., Ltd.; styrene content: 30 wt %) and 20 g of a hydrogenated polystyrene thermoplastic resin Tuftec H1051 (a polystyrene-poly(ethylene/propylene) block-polystyrene copolymer made by Asahi Kasei Corporation; styrene content: 42 wt %), to obtain a 20 wt % solution of SEPTON 4033/Tuftex H1051 in mesitylene. The solution thus obtained was filtered using a 0.2 μm membrane filter, to obtain a resin composition B3. In addition, the Tg of the resin was measured to be 101° C.

Comparative Preparation Example 2

In 190 g of mesitylene, there was dissolved 10 g of a hydrogenated polystyrene thermoplastic resin Tuftec H0143 (a polystyrene-poly(ethylene/propylene) block-polystyrene copolymer made by Asahi Kasei Corporation; styrene content: 67 wt %), to obtain a 5 wt % solution of Tuftec H1043 in mesitylene. The solution thus obtained was filtered using a 0.2 μm membrane filter, to obtain a resin composition B4. Besides, the Tg of the resin was measured to be 107° C.

Note that the method of measuring the Tg of the resin is as follows.

Tg Measuring Method

The resin compositions B1 to B4 were cured by heating at 180° C. for ten minutes, to produce rectangular measurement sheets measuring 30 mm×10 mm and 0.5 mm in thickness. The measurement sheets thus produced were subjected to measurement using a dynamic viscoelasticity measuring apparatus (DMA 7100 made by Hitachi High-Tech Science Corporation) in a temperature range of 0° C. to 300° C. under conditions of a frequency of 1 Hz and a temperature rise rate of 3° C./minute, and a peak (maximum) of tan δ was obtained as the Tg.

[2] Production of Wafer Laminate and Evaluation Thereof

Examples 1 to 6 and Comparative Examples 1 to 3

The resin composition A1, A1', A2, A3, or A4 was applied to a glass plate with a diameter of 200 mm (thickness: 500 μm) by spin coating, and was heated at 180° C. for two minutes and at 250° C. for five minutes by use of a hot plate, to form a material corresponding to the resin layer A in a thickness depicted in Table 1.

Further, the mesitylene solution B1, B2, B3, or B4 was applied to a copper post surface of a silicon wafer with a diameter of 200 mm (thickness: 725 μm) provided with copper posts 10 μm in height and 40 μm in diameter over the entire front surface thereof, or to the resin layer A, by spin coating, and was heated at 150° C. for five minutes and at 180° C. for five minutes, to form the thermoplastic resin layer B in a thickness depicted in Table 1.

A combination of the glass plate-resin layer A and the resin layer B-wafer, or a combination of the glass plate-resin layer A-resin layer B and the wafer, was subjected to lamination under a reduced pressure of up to 1 Pa in a vacuum wafer bonding system (EVG520IS, made by EVG) under the conditions depicted in Table 1, in such a manner that the resin surfaces are bonded to each other or that the resin layer B and the copper post surface of the wafer are bonded to each other, to produce a wafer laminate.

Thereafter, the thus bonded substrate was put to the following tests. The results are set forth in Table 1. Note that evaluations were conducted in the following order.

(1) Adhesion Property Test

The 200 mm wafer bonding was conducted by use of the wafer bonding system EVG520IS made by EVG. The bonding temperature was the value depicted in Table 1, the chamber internal pressure at the time of bonding was up to 1 Pa, and the load was 20 kN. After the bonding, followed by cooling to room temperature, the bonded state at the interface was examined by visual observation and under an optical microscope. In the case where abnormality such as bubbling at the interface was not observed, the result was evaluated to be good and illustrated with "O." In the case where abnormality was observed, the result was evaluated to be bad and illustrated with "X."

(2) Back Grinding Resistance Test

The back side of the silicon wafer was ground using a diamond grindstone of a grinder (DAG810, made by DISCO Corporation). After grinding to a final substrate thickness of 50 μm, the presence or absence of abnormality such as cracks or exfoliation was examined under an optical microscope (100 times). In the case where abnormality was not observed, the result was evaluated to be good and illustrated with "O." In the case where abnormality was observed, the result was evaluated to be bad and illustrated with "X."

(3) CVD Resistance Test

The laminate after the back grinding of the silicon wafer was introduced into a CVD apparatus, a 2 μm $SiO_2$ film formation experiment was conducted, and the presence or absence of abnormality in external appearance was examined. In the case where abnormality in external appearance was not observed, the result was evaluated to be good and illustrated with "O." In the case where abnormality in external appearance such as void, wafer swelling, or wafer breakage was observed, the result was evaluated to be bad and illustrated with "X." The conditions for the CVD resistance test were as follows.

Apparatus name: Plasma Enhanced CVD System PD270STL (made by Samco Inc.)

RF 500 W, Internal pressure 40 Pa

TEOS (tetraethyl orthosilicate):$O_2$=20 sccm:680 sccm (4) Support Delamination Test The delamination property of the support was evaluated by the following method. First, a dicing tape was adhered to the side of the wafer thinned to 50 μm of the wafer laminate having undergone the CVD resistance test, by use of a dicing frame, and the dicing tape side was set onto a suction plate by vacuum suction. Thereafter, irradiation of the entire surface with laser light of 355 nm was conducted from the support side. In the case where the support and the 50 μm wafer could be delaminated without cracking, the result was evaluated to be good and illustrated with "O." In the case where abnormality such as cracking was generated, the result was evaluated to be bad and illustrated with "X."

(5) Clean-Up Test

After the delamination test was finished, a test of property for cleaning up with a solvent was evaluated by the following method. The 200 mm wafer (put to the CVD resistance test) mounted to the dicing frame through the dicing tape was set on a spin coater, with the resin layer B up, cleaning was performed by spraying p-menthane as a cleaning agent thereto for five minutes, and, while rotating the wafer, rinsing was conducted by spraying isopropyl alcohol (IPA). Thereafter, external appearance was observed to check the presence or absence of the residual resin layer B by visual observation. In the case where the residual resin was not observed, the result was evaluated to be good and illustrated with "O." In the case where the residual resin was observed, the result was evaluated to be bad and illustrated with "X."

(6) Transmittance Test

The resin composition A1, A1', A2, A3, or A4 was applied to a 500 μm thick glass plate in a thickness of 0.3 μm by spin coating, was then cured by heating at 250° C. for five minutes to form the resin layer A, and its transmittance (wavelength: 355 nm) was measured by a spectrophotometer (U-4100 model, made by Hitachi High-Tech Science Corporation). In the case where the transmittance was up to 20%, the result was evaluated to be good and illustrated with "O." In the case where the transmittance is more than 20%, the result was evaluated to be bad and illustrated with "X."

Note that when the resin layers A formed on the support substrates by use of the resin solutions A1, A1', A2, and A3 were put to measurement of transmittance, the absorption maximum wavelength was confirmed to be in the range of 300 to 500 nm in every one of the cases.

(7) Measurement of Storage Elastic Modulus

The resin compositions B1 to B4 were cured by heating at 180° C. for ten minutes, to produce rectangular measurement sheets measuring 30 mm×10 mm and 0.5 mm in thickness. The measurement sheets thus produced were subjected to measurement using a dynamic viscoelasticity measuring apparatus (DMA 7100 made by Hitachi High-Tech Science Corporation) in a temperature range of 0° C. to 300° C. under conditions of a frequency of 1 Hz and a temperature rise rate of 3° C./minute, and the value at 25° C. was obtained as storage elastic modulus.

(8) Measurement of Tensile Break Strength

The resin compositions B1 to B4 were cured by heating at 180° C. for ten minutes to form rectangular sheets measuring 200 mm×40 mm and 0.4 mm in thickness, from which No. 5 dumbbell sheets were produced. The measurement sheets thus produced were put to measurement by a tensile tester (V10D made by Toyo Seiki Seisaku-sho Ltd.) at a tension rate of 50 mm/minute, and the strength at break of the measurement sheet was obtained as break strength (MPa).

revealed that contaminations with metal (metal: Ca, K, Na, Mg, Mn, Pb) were all less than the problematic level.

Note that the present invention is not limited to the above embodiments, and the above embodiments are merely illustrative of the present invention. Those which have substantially the same configuration as the technical thought described in claims and which produce the same effects as described herein are embraced in the technical thought of the present invention.

Japanese Patent Application No. 2016-199819 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer laminate comprising a support, an adhesive layer formed on the support, and a wafer laminated so that a front surface of the wafer having a circuit surface faces the adhesive layer, wherein the adhesive layer includes a light-shielding resin layer A and a non-silicone thermoplastic resin-containing resin layer B in this order from a side of the support, the resin layer A is composed of a cured product of a resin composition A containing a resin that has a repeating unit containing a condensed ring in a main chain thereof, wherein the repeating unit is represented by the following formula (1):

TABLE 1

|  | Example | | | | | | Comparative Example | | |
| --- | --- | --- | --- | --- | --- | --- | --- | --- | --- |
|  | 1 | 2 | 3 | 4 | 5 | 6 | 1 | 2 | 3 |
| Resin layer A | A1 | A2 | A3 | A1 | A3 | A3 | A4 | A1' | — |
| Thickness of resin layer A | 0.3 μm | 0.3 μm | 0.3 μm | 0.3 μm | 0.3 μm | 0.3 μm | 0.3 μm | 12 μm | — |
| Transmittance of resin layer A | O | O | O | O | O | O | X | O | — |
|  | (7%) | (12%) | (9%) | (7%) | (9%) | (9%) | (35%) | (<1%) |  |
| Resin layer B | B1 | B1 | B1 | B1 | B2 | B3 | B1 | — | B4 |
| Surface condition of resin layer B (O: uniform surface, X: cracks) | O | O | O | O | O | O | O | — | X |
| Forming direction of resin layer B (a: on wafer, b: on A layer) | a | a | a | b | a | a | a | — | a |
| Thickness of resin layer B (MPa) | 30 μm | 30 μm | 30 μm | 30 μm | 30 μm | 30 μm | 30 μm | — | — |
| E' of resin layer B (MPa) | 23 | 23 | 23 | 23 | 25 | 130 | 23 | — | 760 |
| Tensile break strength of resin layer B (MPa) | 27 | 27 | 27 | 27 | 33 | 40 | 27 | — | 10 |
| Bonding temperature | 200° C. | 200° C. | 200° C. | 200° C. | 200° C. | 200° C. | 200° C. | 200° C. | — |
| Adhesion Visual observation | O | O | O | O | O | O | O | X | — |
| Property Optical microscope | O | O | O | O | O | O | O | X | — |
| Back grinding property | O | O | O | O | O | O | O | — | — |
| CVD resistance | O | O | O | O | O | O | O | — | — |
| Support delamination property | O | O | O | O | O | O | X | — | — |
| Clean-up property | O | O | O | O | O | O | — | — | — |

As depicted in Table 1, it was found that in Examples 1 to 6, temporary adhesion and delamination were easy to perform. On the other hand, in Comparative Example 1, the support was not delaminated and cracking occurred, after irradiation with the laser light. In Comparative Example 2, void was confirmed after the bonding. In Comparative Example 3, cracking occurred after the application of the resin layer B. Note that in Examples 1 to 6, measurement of the wafer surface by SEM-EDX test after the cleaning

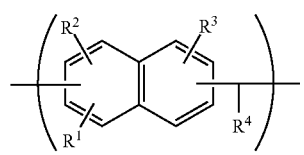

wherein $R^1$ to $R^3$ are each independently a hydrogen atom, a hydroxyl group, or a monovalent organic group having 1 to 20 carbon atoms, provided that at least one of $R^1$ to $R^3$ is a hydroxyl group, and $R^4$ is a hydrogen atom or a monovalent organic group having 1 to 30 carbon atoms which may have a substituent group, and the resin has a weight average molecular weight of 500 to 500,000, and the resin layer B has a storage elastic modulus E' at 25° C. of 1 to 500 MPa and a tensile break strength of 5 to 50 MPa.

2. The wafer laminate according to claim 1, wherein the non-silicone thermoplastic resin of the resin layer B is a resin having a glass transition temperature of −80° C. to 120° C.

3. The wafer laminate according to claim 1, wherein the resin layer A has a transmittance of light of a wavelength of 355 nm of up to 20%.

4. The wafer laminate according to claim 1, wherein the resin composition A further contains a crosslinking agent.

5. The wafer laminate according to claim 1, wherein the resin composition A further contains an acid generating agent.

6. The wafer laminate according to claim 1, wherein the resin composition A further contains an organic solvent.

\* \* \* \* \*